United States Patent [19]
Hatanaka

[11] Patent Number: 5,903,011
[45] Date of Patent: May 11, 1999

[54] SEMICONDUCTOR DEVICE HAVING MONITOR PATTERN FORMED THEREIN

[75] Inventor: Kazuhisa Hatanaka, Oita, Japan

[73] Assignee: Kabushiki Kaisha Toshiba, Kawasaki, Japan

[21] Appl. No.: 08/895,044

[22] Filed: Jul. 16, 1997

[30]     Foreign Application Priority Data

Jul. 29, 1996   [JP]   Japan ................................. 8-199058

[51] Int. Cl.⁶ ............................................. H01L 23/58
[52] U.S. Cl. .............................................................. 257/48
[58] Field of Search ............................... 257/48; 438/14, 438/16, 18

[56]             References Cited

U.S. PATENT DOCUMENTS

5,059,899   10/1991   Farnworth et al. ...................... 438/14
5,598,010   1/1997    Uematsu ................................. 257/48
5,637,186   6/1997    Liu et al. ................................. 438/14

*Primary Examiner*—Tom Thomas
*Assistant Examiner*—William Hughes
*Attorney, Agent, or Firm*—Finnegan, Henderson, Farabow, Garrett & Dunner, L.L.P.

[57]              ABSTRACT

An object of this invention is to provide a semiconductor device having a monitor pattern which can more strictly ensure the precise finish dimension of a semiconductor integrated circuit device. According to this invention, in a semiconductor device in which a first monitor pattern for monitoring a variation in the dimension of the pattern of the semiconductor integrated circuit device is formed on a semiconductor substrate, the first monitor pattern includes a first SDG region pattern formed on the semiconductor substrate a second SDG region pattern formed on the semiconductor substrate, at least one first gate wiring pattern formed on the first and second SDG region patterns a third SDG region pattern having an area different from the area of the first SDG region pattern and formed on the semiconductor substrate a fourth SDG region pattern having an area different from the area of the first SDG region pattern and formed on the semiconductor substrate and at least one second gate wiring pattern formed on the third and fourth SDG region patterns.

28 Claims, 6 Drawing Sheets

SEMICONDUCTOR DEVICE HAVING MONITOR PATTERN FORMED THEREIN

BACKGROUND OF THE INVENTION

This invention relates to a semiconductor device in which a monitor pattern for monitoring a variation in the patterning dimension of a resist film used for forming a semiconductor integrated circuit device (LSI device) and for monitoring a precise finish dimension of the LSI device is formed.

Further, this invention relates to a method for manufacturing the above semiconductor device.

A monitor pattern formed in a semiconductor device is used particularly for ensuring the precise finish dimension of an LSI device during a fine patterning process using lithography technology.

As is well known in the art of semiconductor device manufacturing processes, and in particular, in the fine patterning process using the lithography technology, it is known that even if the dimension of a resist film pattern used for forming elements in an LSI device defined by the mask is constant, some portions of the resist film pattern will be formed with different finish dimensions, for example, by the standing wave effect of light caused by a variation in the film thickness of a resist film due to a difference in level of the background layer, the microloading effect caused by a variation in the supply amount of an etchant due to a difference in the density of the mask pattern, or the proximity effect caused by a variation in the exposure light amount due to a variation in the density (dense or sparse arrangement) of the mask pattern.

That is, a variation occurs in the dimension of the resist film in principle by patterning.

However, conventionally, for example, a quality control (QC) or monitor pattern having a specified pattern dimension is formed on the scribe line of a wafer. Whether the pattern dimension of the monitor pattern is set within a specified range or not is determined by monitoring the dimension thereof so as to ensure the precise finish dimension of the LSI device even though a difference in level of the background layer randomly exists in the actual LSI device.

Therefore, with the conventional monitor pattern, a variation in the finish dimension of the entire portion of the LSI device cannot be monitored and the precise finish dimension of the LSI device cannot always be ensured.

Particularly, the dimension of the LSI device is finally determined by the finish dimension obtained after the etching process, but the difference between the dimension of the resist film pattern and the finish dimension, that is, the etching conversion difference is largely dependent on a difference in the density (dense or sparse arrangement) of the resist film pattern.

Therefore, the etching conversion difference determined by use of the conventional QC pattern formed with the specified pattern dimension cannot be applied to the entire portion of the resist film pattern in the LSI device, and strictly speaking, the precise finish dimension of the LSI device is not ensured at all in the prior art.

As described above, conventionally, a variation in the dimension of the resist film pattern in the actual LSI device cannot be monitored and there occurs a problem that the precise finish dimension of the LSI device is not always ensured.

This invention has been made in consideration of the above condition, and an object of this invention is to provide a semiconductor device having a monitor pattern with which variations in the dimensions of all of the element forming patterns in an actual semiconductor integrated circuit device can be monitored and in which the precise finish dimension of the semiconductor integrated circuit device can be more strictly ensured.

Further, an object of this invention is to provide a method for manufacturing the above semiconductor device.

BRIEF SUMMARY OF THE INVENTION

In order to achieve the above object, according to a first aspect of this invention, in a semiconductor device in which a first monitor pattern for monitoring a variation in the dimension of the pattern of a semiconductor integrated circuit device is formed on a semiconductor substrate, the first monitor pattern comprises a first source, drain, and gate (SDG) or active region pattern formed on the semiconductor substrate; a second SDG region pattern formed on the semiconductor substrate; at least one first gate wiring pattern formed on the first and second SDG region patterns; a third SDG region pattern having an area different from the area of the first SDG region pattern and formed on the semiconductor substrate; a fourth SDG region pattern having an area different from the area of the first SDG region pattern and formed on the semiconductor substrate; and at least one second gate wiring pattern formed on the third and fourth SDG region patterns.

According to a second aspect of this invention, in the first aspect, the areas of said first and second SDG region patterns are each set equal to a first area which is a minimum permissible area according to a design rule in the semiconductor integrated circuit device, the gate dimension of said first gate wiring pattern is equal to the gate dimension of minimum permissible width according to the design rule in the semiconductor integrated circuit device, the areas of said third and fourth SDG region patterns are each set to an area larger than the first area, and the gate dimension of said second gate wiring pattern is equal to the gate dimension of minimum permissible width in the semiconductor integrated circuit device.

According to a third aspect of this invention, in the first aspect, the areas of said first and second SDG region patterns are each set equal to a minimum permissible area according to a design rule in the semiconductor integrated circuit device, the gate dimension of said first gate wiring pattern is equal to the gate dimension of minimum permissible width according to the design rule in the semiconductor integrated circuit device, the areas of said third and fourth SDG region patterns are each set equal to one of the areas of SDG region patterns which are provided in largest numbers in the semiconductor integrated circuit device, and the gate dimension of said second gate wiring pattern is equal to the gate dimension of minimum permissible width according to the design rule in the semiconductor integrated circuit device.

According to a fourth aspect of this invention, in the first aspect, the areas of the first and second SDG region patterns are each set to an area larger than a minimum permissible area according to a design rule in the semiconductor integrated circuit device, the gate dimension of said first gate wiring pattern is equal to the gate dimension of minimum permissible width according to the design rule in the semiconductor integrated circuit device, the areas of said third and fourth SDG region patterns are each set equal to one of the areas of SDG region patterns which are provided in largest numbers in the semiconductor integrated circuit device, and the gate dimension of said second gate wiring pattern is equal to the gate dimension of minimum permissible width according to the design rule in the semiconductor integrated circuit device.

According to a fifth aspect of this invention, in a semiconductor device in which a first monitor pattern for monitoring a variation in the dimension of the pattern of a semiconductor integrated circuit device is formed on a semiconductor substrate, the first monitor pattern comprises a first SDG region pattern formed on the semiconductor substrate; a second SDG region pattern formed on the semiconductor substrate; at least one first gate wiring pattern formed on the first and second SDG region patterns; a third SDG region pattern having an area larger than the area of the first and second SDG region patterns and formed on the semiconductor substrate; and at least one second gate wiring pattern formed on the third SDG region pattern.

According to a sixth aspect of this invention, in the fifth aspect, the areas of said first and second SDG region patterns are each set equal to a minimum permissible area according to a design rule in the semiconductor integrated circuit device, the gate dimension of said first gate wiring pattern is equal to the gate dimension of minimum permissible width according to the design rule in the semiconductor integrated circuit device, the area of said third SDG region pattern is set to an area larger than each of the areas of SDG region patterns which are provided in largest numbers in the semiconductor integrated circuit device, and the gate dimension of said second gate wiring pattern is equal to the gate dimension of minimum permissible width according to the design rule in the semiconductor integrated circuit device.

According to a seventh aspect of this invention, in the fifth aspect, the areas of said first and second SDG region patterns are each set equal to a minimum permissible area according to a design rule in the semiconductor integrated circuit device, the gate dimension of said first gate wiring pattern is equal to the gate dimension of minimum permissible width according to the design rule in the semiconductor integrated circuit device, the area of said third SDG region pattern is set to an area in which the film thickness of a resist film is saturated in the semiconductor integrated circuit device, and the gate dimension of said second gate wiring pattern is equal to the gate dimension of minimum permissible according to the design rule width in the semiconductor integrated circuit device.

According to an eighth aspect of this invention, in the fifth aspect, the areas of said first and second SDG region patterns are each set to an area larger than a minimum permissible area according to a design rule in the semiconductor integrated circuit device, the gate dimension of said first gate wiring pattern is equal to the gate dimension of minimum permissible width according to the design rule in the semiconductor integrated circuit device, the area of said third SDG region pattern is set to an area larger than each of the areas of SDG region patterns which are provided in largest numbers in the semiconductor integrated circuit device, and the gate dimension of said second gate wiring pattern is equal to the gate dimension of minimum permissible width according to the design rule in the semiconductor integrated circuit device.

According to a ninth aspect of this invention, in the fifth aspect, the areas of said first and second SDG region patterns are each set to an area larger than a minimum permissible area according to a design rule in the semiconductor integrated circuit device, the gate dimension of said first gate wiring pattern is equal to the gate dimension of minimum permissible width according to the design rule in the semiconductor integrated circuit device, the area of said third SDG region pattern is set to an area in which the film thickness of a resist film is saturated in the semiconductor integrated circuit device, and the gate dimension of said second gate wiring pattern is equal to the gate dimension of minimum permissible width according to the design rule in the semiconductor integrated circuit device.

According to a tenth aspect of this invention, in the fifth aspect, the areas of said first and second SDG region patterns are each set equal to one of the areas of SDG region patterns which are provided in largest numbers in the semiconductor integrated circuit device, the gate dimension of said first gate wiring pattern is equal to the gate dimension of minimum permissible width according to a design rule in the semiconductor integrated circuit device, the area of said third SDG region pattern is set to an area larger than each of the areas of the SDG region patterns which are provided in largest numbers in the semiconductor integrated circuit device, and the gate dimension of said second gate wiring pattern is equal to the gate dimension of minimum permissible width according to the design rule in the semiconductor integrated circuit device.

According to an eleventh aspect of this invention, in the fifth aspect, the areas of said first and second SDG region patterns are each set equal to one of the areas of SDG region patterns which are provided in largest numbers in the semiconductor integrated circuit device, the gate dimension of said first gate wiring pattern is equal to the gate dimension of minimum permissible width according to a design rule in the semiconductor integrated circuit device, the area of said third SDG region pattern is set to an area in which the film thickness of a resist film is saturated in the semiconductor integrated circuit device, and the gate dimension of said second gate wiring pattern is equal to the gate dimension of minimum permissible width according to the design rule in the semiconductor integrated circuit device.

According to a twelfth aspect of this invention, in a semiconductor device in which a first monitor pattern for monitoring a variation in the dimension of the pattern of a semiconductor integrated circuit device is formed on a semiconductor substrate, the first monitor pattern comprises a first SDG region pattern formed on the semiconductor substrate; a second SDG region pattern formed on the semiconductor substrate; at least one first gate wiring pattern formed on the first and second SDG region patterns; a third SDG region pattern formed on the semiconductor substrate; a fourth SDG region pattern formed on the semiconductor substrate; and second gate wiring patterns formed on the third and fourth SDG region patterns and larger in number than the first gate wiring pattern.

According to a thirteenth aspect of this invention, in the twelfth aspect, the areas of said first to fourth SDG region patterns are each set equal to one of the areas of SDG region patterns which are provided in largest numbers in the semiconductor integrated circuit device, the gate dimension of each of said first and second gate wiring patterns is equal to the gate dimension of minimum permissible width according to a design rule in the semiconductor integrated circuit device, and said second gate wiring patterns are formed at the minimum permissible intervals according to the design rule in the semiconductor integrated circuit device.

According to this invention, a variation in the patterning dimension of the gate wiring due to a difference in the density (dense or sparse arrangement) of the gate wirings can be monitored.

According to a fourteenth aspect of this invention, in a semiconductor device in which a first monitor pattern for monitoring a variation in the dimension of the pattern of a semiconductor integrated circuit device is formed on a semiconductor substrate, the first monitor pattern comprises a first SDG region pattern formed on the semiconductor substrate; a second SDG region pattern formed on the semiconductor substrate; at least one first gate wiring pattern formed on the first and second SDG region patterns; a third SDG region pattern formed in a region on the semiconductor substrate in which other SDG regions of a smaller number than the number of SDG regions in a region in which the first and second SDG regions are formed are formed; a fourth SDG region pattern formed in a region on the semiconductor substrate in which other SDG regions of a smaller number than the number of SDG regions in a region in which the first and second SDG regions are formed are formed; and at least one second gate wiring pattern formed on the third and fourth SDG region patterns.

According to a fifteenth aspect of this invention, in the fourteenth aspect, the areas of said first and second SDG region patterns are each set equal to one of the areas of SDG region patterns which are provided in largest numbers in the semiconductor integrated circuit device, the gate dimension of said first gate wiring pattern is equal to the gate dimension of minimum permissible width according to a design rule in the semiconductor integrated circuit device, the areas of said third and fourth SDG region patterns are each set equal to one of the areas of the SDG region patterns which are provided in largest numbers in the semiconductor integrated circuit device, and the gate dimension of said second gate wiring pattern is equal to the gate dimension of minimum permissible width according to the design rule in the semiconductor integrated circuit device.

According to a sixteenth aspect of this invention, in the fourteenth aspect, the areas of said first and second SDG region patterns are each set to the minimum permissible area according to a design rule in the semiconductor integrated circuit device, the gate dimension of said first gate wiring pattern is equal to the gate dimension of minimum permissible width according to the design rule in the semiconductor integrated circuit device, the areas of said third and fourth SDG region patterns are each set to the minimum permissible area according to the design rule in the semiconductor integrated circuit device, and the gate dimension of said second gate wiring pattern is equal to the gate dimension of minimum permissible width according to the design rule in the semiconductor integrated circuit device.

According to this invention, a variation in the patterning dimension of the gate wiring due to a difference in the density (dense or sparse arrangement) of the SDG regions can be monitored.

According to a seventeenth aspect of this invention, in the first, fifth, twelfth or fourteenth aspect, the first monitor pattern is formed on a scribe line adjacent to the semiconductor integrated circuit device.

According to an eighteenth aspect of this invention, in the first, fifth, twelfth or fourteenth aspect, the semiconductor device further comprises a second monitor pattern formed on the semiconductor substrate and obtained by rotating the first monitor pattern by 90°.

Further, according to a nineteenth aspect of this invention, there is provided a method for manufacturing a semiconductor device in which a monitor pattern for monitoring a variation in the dimension of the pattern of a semiconductor integrated circuit device is formed on a semiconductor substrate which comprises the steps of forming an independent field oxide film region on the semiconductor substrate; depositing polysilicon which is a gate electrode material of the monitor pattern on the semiconductor substrate and the field oxide film region; coating a photoresist material for lithography on the polysilicon; removing parts of the polysilicon and photoresist material which are not formed in a portion used as the gate of the monitor pattern; and removing part of the photoresist material which lies in a portion used as the gate of the monitor pattern.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

There will now be described embodiments of this invention with reference to the accompanying drawings.

Figure 1:
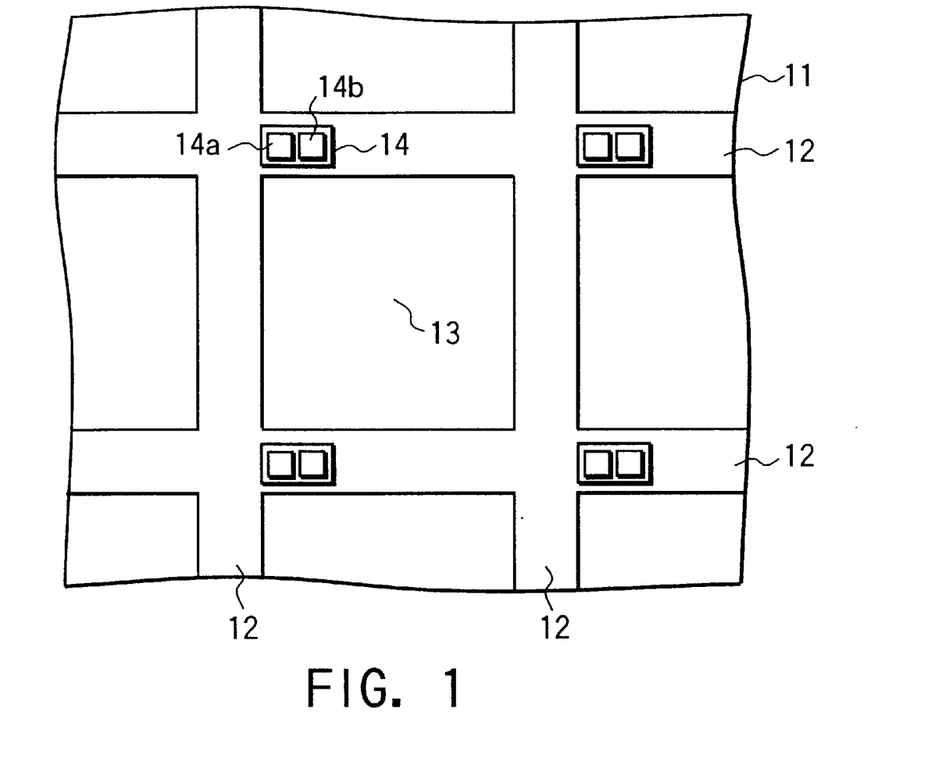
FIG. 1 is a plan view showing a semiconductor device according to one embodiment of this invention in which semiconductor integrated circuit devices (LSI devices) are formed.
Figure 2:
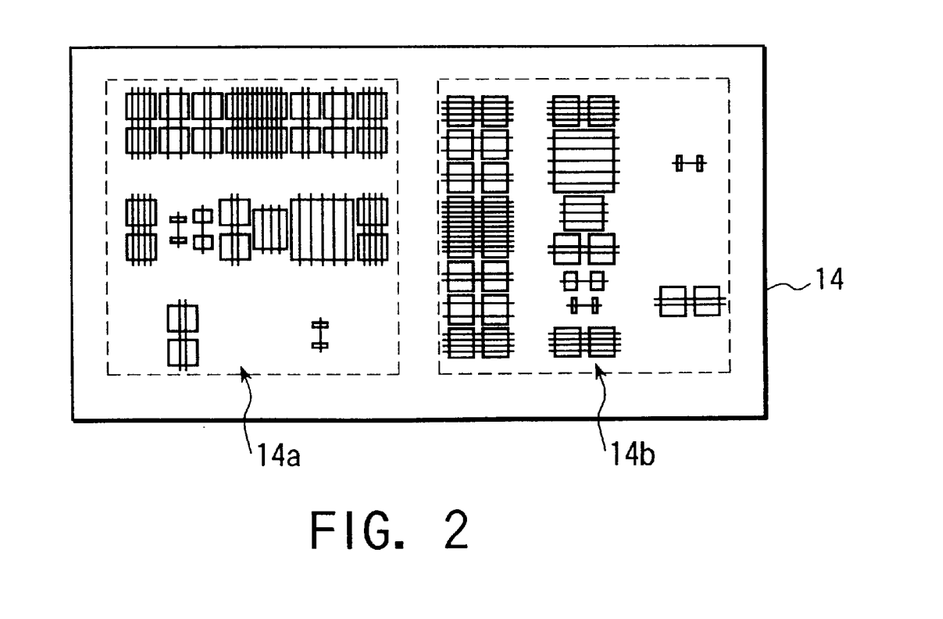
FIG. 2 is a plan view showing a monitor pattern in a monitor pattern forming area formed in the semiconductor device shown in FIG. 1.

FIG. 1 is a plan view showing a semiconductor device according to one embodiment of this invention in which semiconductor integrated circuit devices (LSI devices) are formed. FIG. 2 is a plan view showing a monitor pattern in a monitor pattern forming area formed in the semiconductor device shown in FIG. 1.

As shown in FIG. 1, a semiconductor wafer (semiconductor substrate) 11 is divided into a plurality of element formation areas 13 in which LSI devices are formed by scribe lines 12.

On the scribe lines 12, monitor pattern formation regions 14 are formed corresponding to the respective element formation areas 13. In each of the monitor pattern formation regions 14, one set (one pair) of monitor patterns 14a, 14b are formed.

The monitor patterns 14a, 14b are arranged with the directions thereof set at an angle of 90°.

Figure 3:
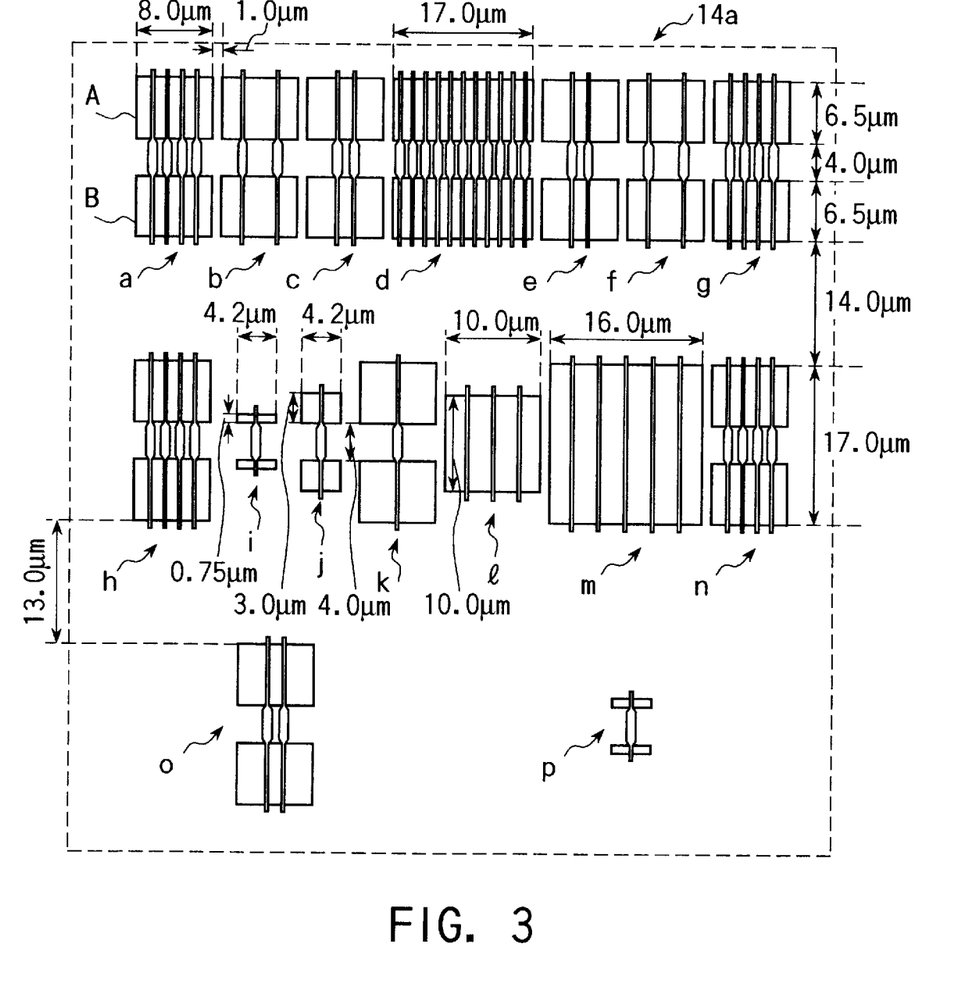
FIG. 3 is a plan view showing a monitor pattern 14a in the monitor pattern forming area formed in the semiconductor device shown in FIG. 1.

FIG. 3 is a plan view showing the monitor pattern 14a in the monitor pattern forming area formed in the semiconductor device shown in FIG. 1.

In this example, the monitor pattern 14a is shown, but it is assumed that the monitor pattern 14b also has the same pattern as that of the monitor pattern 14a.

However, the monitor pattern 14b is rotated by an angle of 90° with respect to the monitor pattern 14a. Further, the dimension of the monitor pattern shown in FIG. 3 is based on the 0.6 $\mu$m design rule.

Figure 4:
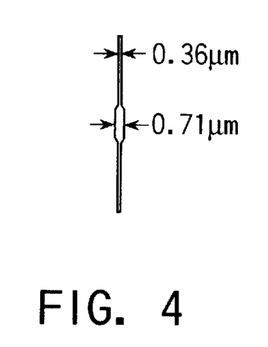
FIG. 4 is a view showing the dimension of a gate wiring pattern B in the 0.6 μm design rule.

FIG. 4 is a view showing the dimension of a gate wiring pattern B in the 0.6 $\mu$m design rule The monitor pattern 14a is used for monitoring a variation in the patterning dimension of the gate wiring in the actual LSI device and is constructed by 16 unit patterns a to p.

Each of the unit patterns a to p includes a rectangular SDG region pattern or patterns A and a linear gate wiring pattern (resist film pattern) or patterns B to be monitored.

In each of the unit patterns a, g, h, and n in the monitor pattern 14a, two SDG or active region patterns A, each having an area equal to one of areas which is provided in largest numbers in the actual LSI device, are arranged at an interval which is frequently used in the LSI device.

Further, four gate wiring patterns B having the gate dimension of minimum permissible width on the design rule (the minimum gate dimension which determines the operation speed of the LSI device), that is, the gate dimension of minimum permissible width in the LSI device, are formed at minimum permissible intervals in the LSI device on the background stepped portion containing the two SDG region patterns A.

Figure 5:
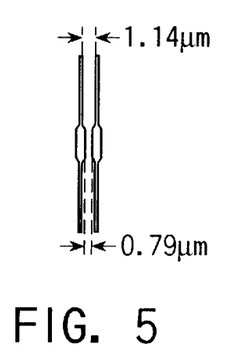
FIG. 5 is a view showing the minimum interval in a gate wiring pattern in the 0.6 μm design rule.

For example, in the case of 0.6 $\mu$m design rule, the dimension of the SDG region pattern A is 8.0×6.5 $\mu$m the interval between the SDG region patterns A is 4.0 $\mu$m, the gate dimension is 0.36 $\mu$m, and the interval is 1.14 $\mu$m as shown in FIG. 5.

In each of the unit patterns b and f, two SDG region patterns A, each having an area equal to one of the areas which is provided in largest numbers in the actual LSI device, are arranged at an interval which is frequently used in the LSI device.

Further, two gate wiring patterns B having the gate dimension of minimum permissible width on the design rule, that is, the gate dimension of minimum permissible width in the LSI device, are formed at the largest interval among intervals which are frequently used in the semiconductor device.

Figure 6:
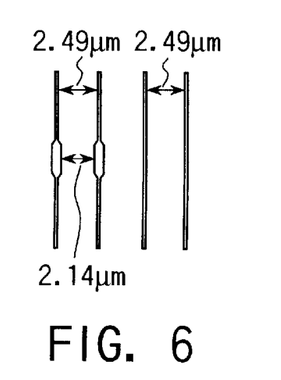
FIG. 6 is a view showing the maximum interval in a gate wiring pattern in the 0.6 μm design rule.

For example, in the case of 0.6 $\mu$m design rule, the largest interval is 2.49 $\mu$m as shown in FIG. 6.

In each of the unit patterns c, e, o, two SDG region patterns A each having an area equal to one of the areas which are provided in largest numbers in the actual LSI device are arranged at an interval which is high frequently used in the LSI device.

Further, two gate wiring patterns B having the gate dimension of minimum permissible width on the design rule, that is, the gate dimension of minimum permissible width in the LSI device, are formed at a minimum permissible interval in the LSI device on the background stepped portion containing the two SDG region patterns A.

In the unit pattern d, two SDG region patterns A, each having an area which is approximately two times wider in the lateral direction than each of the areas which is provided in largest numbers in the actual LSI device, are arranged at an interval which is frequently used in the LSI device.

Further, eleven gate wiring patterns B having the gate dimension of minimum permissible width on the design rule are formed at minimum permissible intervals in the LSI device on the background stepped portion containing the two SDG region patterns A.

In each of the unit patterns i and p, two SDG region patterns A, each having a minimum permissible area on the design rule, that is, a minimum permissible area in the LSI device, are arranged at an interval which is frequently used in the LSI device.

Further, one gate wiring pattern B having the gate dimension of minimum permissible width on the design rule is formed on the background stepped portion containing the two SDG region patterns A.

For example, in the unit pattern j, two SDG region patterns A, each having an area which is approximately four times larger in the longitudinal direction than the minimum permissible area on the design rule, are arranged at an interval which is frequently used in the LSI device.

Further, one gate wiring pattern B having the gate dimension of minimum permissible width on the design rule is formed on the background stepped portion containing the two SDG region patterns A.

In the unit pattern k, two SDG region patterns A, each having an area equal to one of the areas which is provided in largest numbers in the actual LSI device, are arranged at an interval which is frequently used in the LSI device.

Further, one gate wiring pattern B having the gate dimension of minimum permissible width on the design rule is formed on the background stepped portion containing the two SDG region patterns A.

In the unit pattern l, one SDG region pattern A having an area which is approximately 1.5 times larger in the longitudinal direction than each of the areas which are provided in largest numbers in the actual LSI device is formed.

Further, three gate wiring patterns B having the gate dimension of minimum permissible width on the design rule are formed at maximum permissible intervals in the LSI device on the background stepped portion containing the SDG region pattern A.

Figure 14:
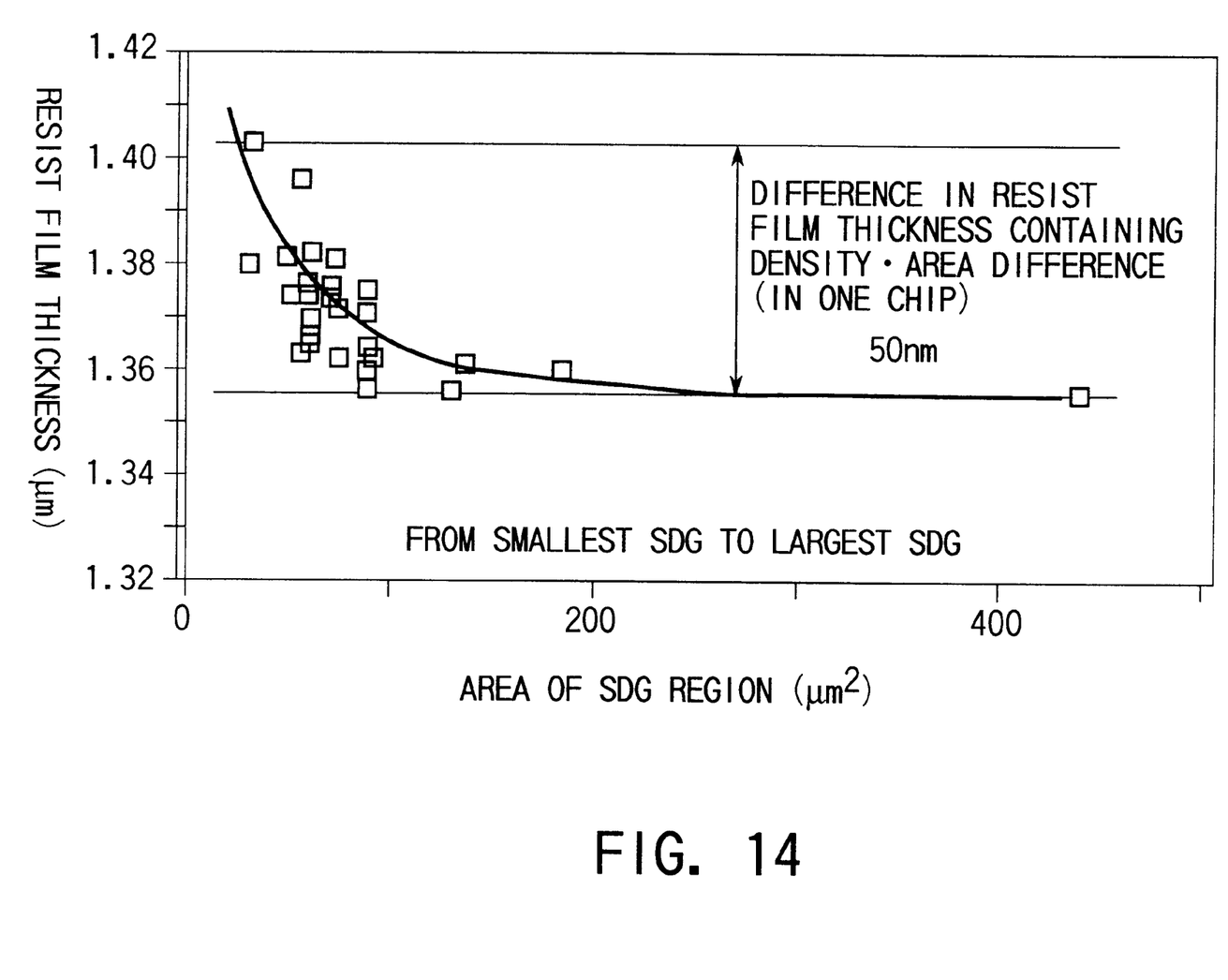
FIG. 14 is a diagram showing the correlation between the area of an SDG region which is a background and the film thickness of a resist film.

In the unit pattern m, one SDG region pattern A having an area of 16.0×17.0 $\mu$m$^2$ in which the film thickness of a resist film is saturated in the actual LSI device as is understood from FIG. 14 is formed. Five gate wiring patterns B, each having the gate dimension of minimum permissible width on the design rule, are formed at maximum permissible intervals in the LSI device on the background stepped portion containing the SDG region pattern A.

The unit patterns a to n are patterns which are densely formed close to each other. The unit patterns o and p are patterns which are respectively obtained by independently and sparsely forming the unit pattern c or e and the unit pattern i, which are arranged in a dense form.

According to the monitor pattern 14a, for example, a variation in the patterning dimension of the gate wiring caused by a difference in the area of the SDG region on the actual LSI device can be monitored based on a difference (variation) in the patterning dimension of each of the gate wiring patterns B of the unit patterns i to m.

Further, for example, a variation in the patterning dimension of the gate wiring depending on a difference in the density (dense or sparse arrangement) of the gate wirings on the actual LSI device can be monitored based on a difference in the patterning dimension of each of the gate wiring patterns B of the unit patterns a to c and k.

Further, for example, a variation in the patterning dimension of the gate wiring depending on a difference in the density (dense or sparse arrangement) of the SDG regions on the actual LSI device can be monitored based on a difference in the patterning dimension of each of the gate wiring patterns B of the unit patterns c and o and the unit patterns i and p.

Further, for example, a variation in the patterning dimension of the gate wiring caused by the proximity effect on the actual LSI device can be monitored based on a difference in the patterning dimension of each of the eleven gate wiring patterns B of the unit pattern d.

Thus, for example, if the monitor pattern 14a is formed based on the relation between the area of the background SDG region and the film thickness of the resist film, the relation between the dense/sparse arrangement of the SDG region and the film thickness of the resist film, and based on the dense/sparse arrangement of the gate wiring in the actual LSI device, the etching conversion difference derived by use of the monitor pattern 14a can be applied to all of the gate wirings in the LSI device and it becomes possible to monitor variations including a variation in the patterning dimension of the gate wiring in the actual LSI device.

That is, in the monitor pattern 14a, the film thickness of the resist film which varies depending on a difference in the area of the SDG regions randomly arranged on the actual LSI device can be realized by changing the area of the SDG region pattern A, for example, from the minimum area which can be attained on the design rule to the maximum area in which the film thickness of the resist film is stable. As a result, a variation in the element dimension due to a variation in the film thickness of the resist film can be monitored.

Further, in the monitor pattern 14a, the film thickness of the resist film which varies depending on a difference in the density of arrangement of the SDG regions randomly arranged on the actual LSI device can be realized by changing the density of arrangement of the SDG region patterns A, for example, from the highest density thereof which can be attained on the layout to substantially the lowest density thereof. As a result, a variation in the element dimension due to a variation in the film thickness of the resist film can be monitored.

Further, in the monitor pattern 14a, the microloading effect caused by a difference in the density of arrangement of the gate wirings on the actual LSI device can be artificially realized by changing the arrangement interval of the gate wiring patterns B, for example, from the minimum interval at which they are arranged with the highest permissible density on the layout to the maximum interval at which they are arranged with substantially the lowest density, and as a result, a variation in the element dimension due to the microloading effect can be monitored.

Further, in the monitor pattern 14a, the proximity effect caused by the dense arrangement of the gate wirings on the actual LSI device can be artificially realized by arranging the gate wiring patterns B as close to each other as possible on the layout.

Since the monitor pattern 14b which is obtained by rotating the monitor pattern 14a by 90° is provided together with the monitor pattern 14a, a variation in the patterning dimension of the gate wiring due to the microloading effect on the actual LSI device, which is caused by a difference in the patterning dimension of the gate wiring pattern B due to a difference in the direction in which liquid developer flows, can be monitored.

Next, a method for manufacturing a monitor pattern according to one embodiment of this invention is explained.

Figure 7:
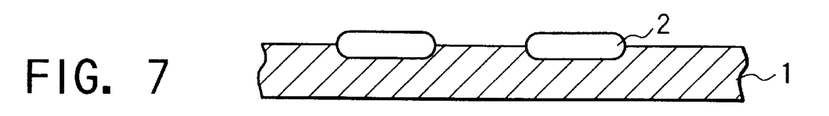
FIG. 7 is a view for illustrating a method for manufacturing a monitor pattern according to one embodiment of this invention.

First, as shown in FIG. 7, an independent element isolating region 2 is formed on a silicon substrate 1. Formation of the element isolating region is effected by use of the general element isolation technique. The element region 2 is a thick field oxide film for isolating independent element areas from one another.

After this, a thin gate oxide film (approx. 100 Å) constructing a MOS transistor is formed.

Figure 8:
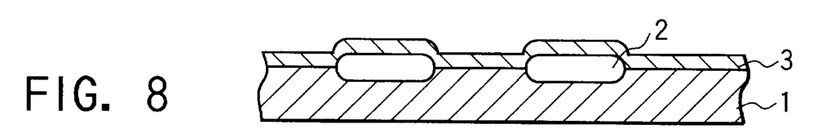
FIG. 8 is a view for illustrating the method for manufacturing the monitor pattern according to the embodiment of this invention.

Then, as shown in FIG. 8, polysilicon 3 which is a gate electrode material of the MOS transistor is deposited.

Figure 9:
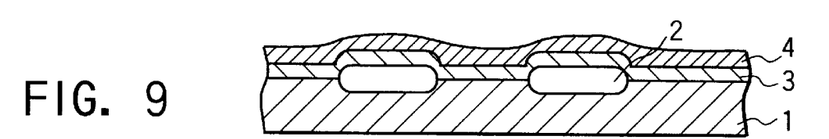
FIG. 9 is a view for illustrating the method for manufacturing the monitor pattern according to the embodiment of this invention.

Next, as shown in FIG. 9, a photoresist material 4 for photolithography is coated on the polysilicon film 3.

Figure 10:
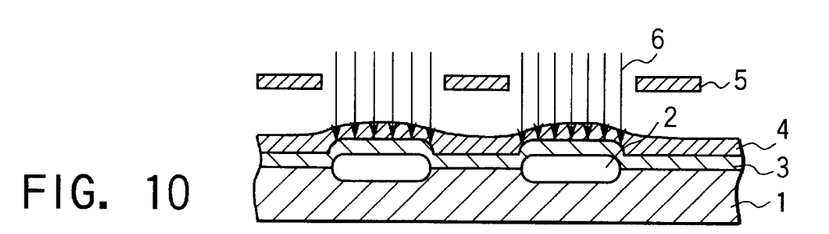
FIG. 10 is a view for illustrating the method for manufacturing the monitor pattern according to the embodiment of this invention.

Then, as shown in FIG. 10, after a photomask 5 is formed, the photoresist material 4 is exposed to light. In FIG. 10, a reference numeral 6 denotes light beams for lithography.

Figure 11:
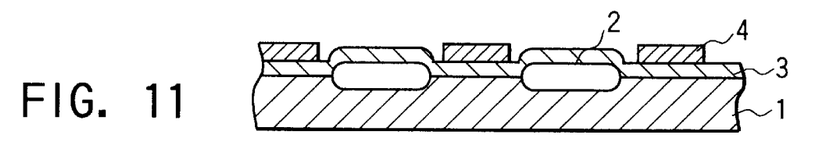
FIG. 11 is a view for illustrating the method for manufacturing the monitor pattern according to the embodiment of this invention.

After this, as shown in FIG. 11, the exposed unwanted portion of the photoresist material 4 is removed by development.

Figure 12:
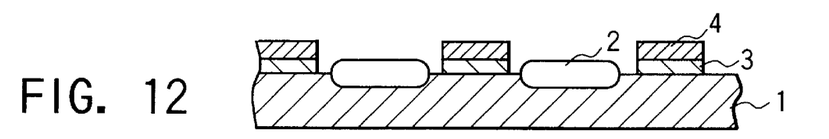
FIG. 12 is a view for illustrating the method for manufacturing the monitor pattern according to the embodiment of this invention.

Then, as shown in FIG. 12, the polysilicon film 3 is selectively removed by etching with the remaining photoresist material 4 used as a mask.

Figure 13:
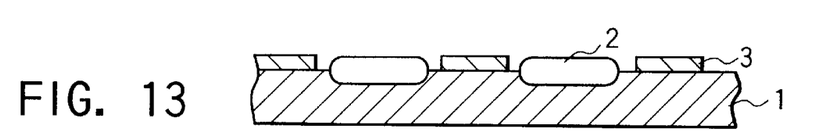
FIG. 13 is a view for illustrating the method for manufacturing the monitor pattern according to the embodiment of this invention.

Next, as shown in FIG. 13, the photoresist material 4 is removed by ashing or the like to form a MOS transistor. The MOS transistor is the monitor pattern itself.

FIG. 14 shows the correlation between the area of the background SDG region and the film thickness of the resist film in an LSI device.

Since the film thickness of the resist film also depends on the area of the background SDG region, the areas of the SDG region patterns A in the unit patterns a to p of the monitor patterns 14a, 14b are determined based on the above correlation, for example.

Thus, the area of the SDG region pattern A in the unit pattern m having the maximum area in which the film thickness of the resist film is saturated can be derived with high precision.

Figure 15:
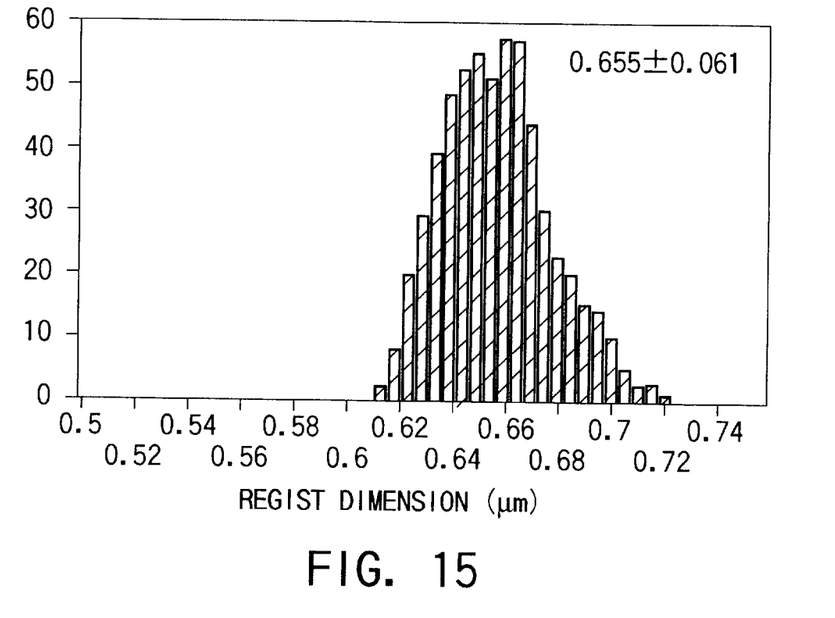
FIG. 15 is a histogram showing the performance of a monitor pattern formed in the semiconductor device according to one embodiment of this invention.
Figure 16:
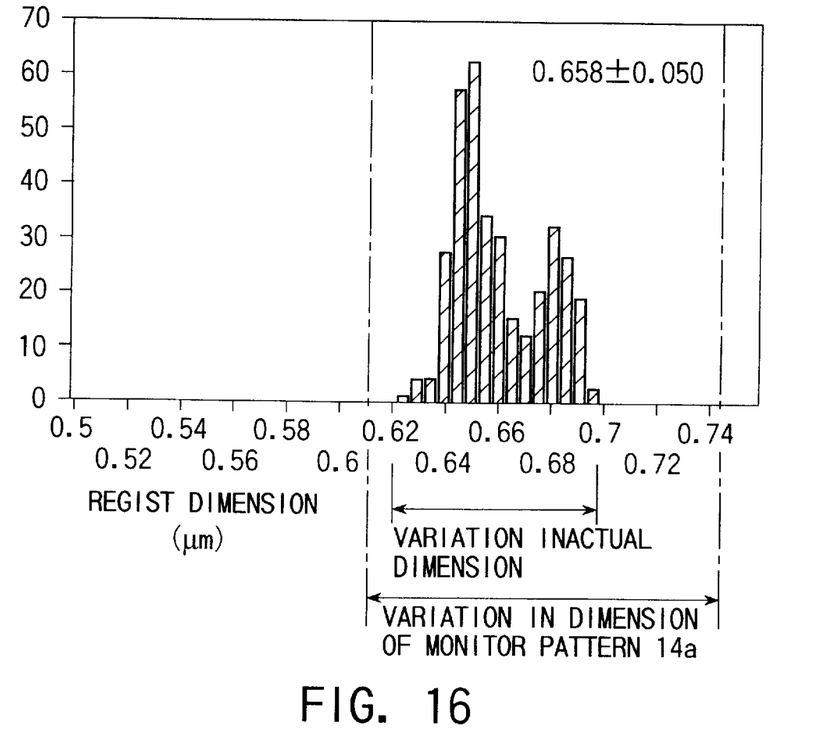
FIG. 16 is a histogram showing the performance of a monitor pattern formed in the semiconductor device according to one embodiment of this invention.

FIGS. 15 and 16 are histograms for verifying the monitoring performance realized by use of the monitor patterns 14a, 14b.

FIG. 15 shows the result of evaluation of a variation in the patterning dimension of the gate wiring pattern B in the monitor pattern 14a, 14b for an LSI device by using an actual product and FIG. 16 shows the result of evaluation of a variation in the actual patterning dimension of a typical gate wiring in the above LSI device by using the actual product.

As is clearly understood from FIGS. 15 and 16, for example, a variation in the patterning dimension of the gate wiring pattern B in the monitor pattern 14a completely covers (contains) a variation in the patterning dimension of the gate wiring in the actual LSI device.

Therefore, it is possible to strictly ensure the precise finish dimension of the gate wiring in the LSI device by monitoring that the dimension of the gate wiring pattern B of the monitor pattern 14a lies within the specification limit.

Further, if it is detected by the monitoring that the finish dimension of the gate wiring in the LSI device lies outside the allowed specification limit, the off-specification gate wiring pattern B is specified and the dependency on the cause of the variation in the patterning dimension is determined so that the cause of the variation can be easily estimated and the countermeasure and evaluation can be made in the early stage.

As described above, a variation in the patterning dimension of the gate wiring on the actual LSI device can be completely covered.

That is, the monitor pattern is formed based, for example, on the relation between the area of the background SDG region and the film thickness of the resist film, on the relation between the dense/sparse arrangement of the SDG region and the film thickness of the resist film, and on the dense/sparse arrangement of the gate wiring in the actual LSI device. Therefore, the etching conversion difference derived by use of the monitor pattern can be applied to all of the gate wirings in the LSI device.

Thus, it becomes possible to monitor variations including a variation in the patterning dimension of the gate wiring in the actual LSI device and more strictly ensure the precise finish dimension of the LSI device.

Figure 17:
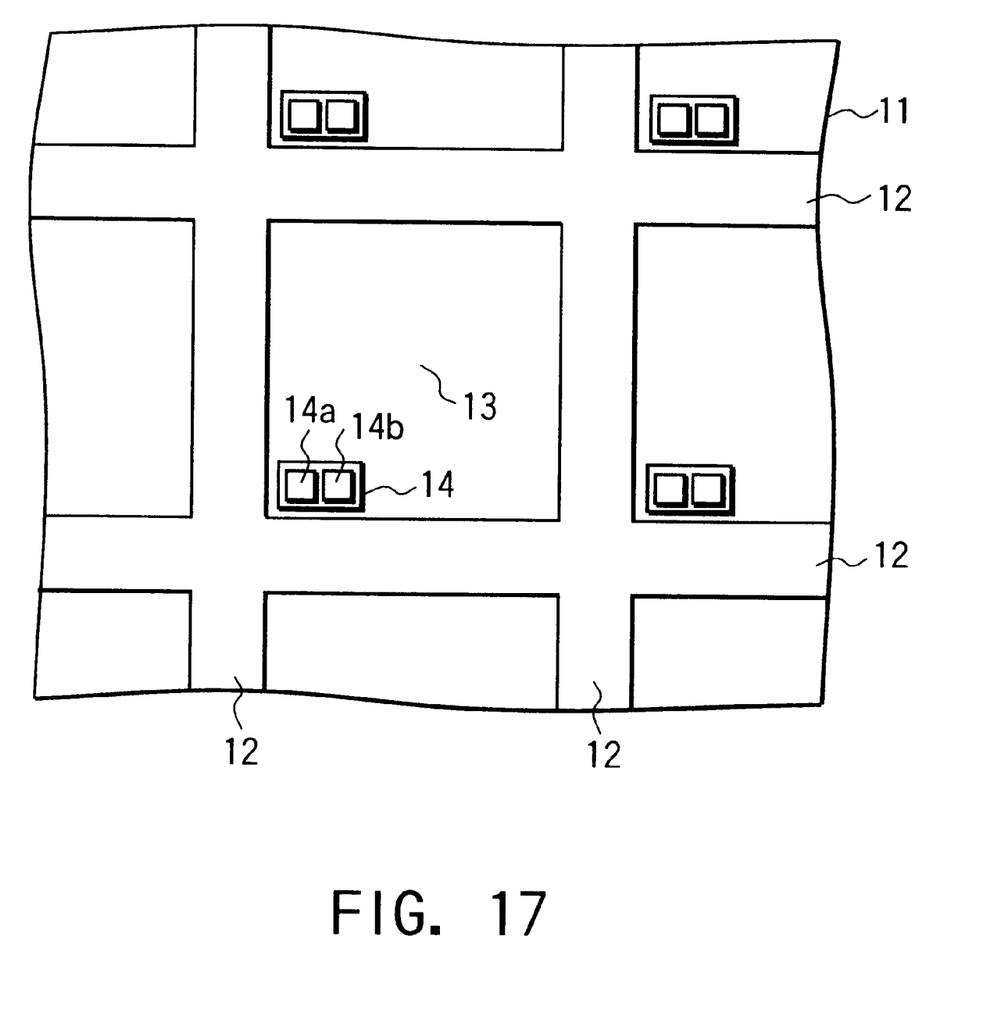
FIG. 17 is a view showing a semiconductor device having a monitor pattern formed in a space portion in an element forming area.

In the embodiment of this invention described above, a case wherein the monitor pattern is formed on the scribe line is explained, but this is not limiting. For example, as shown in FIG. 17, it is possible to form monitor patterns in a space area of the element formation area.

Further, this invention can be applied not only to a case wherein a variation in the patterning dimension of the gate wiring is monitored, but also to a case wherein a variation in the patterning dimension of an upper wiring of a multi-layer wiring structure is monitored, for example.

In addition, it is of course possible to variously modify this invention without departing from the technical scope thereof.

As described above, according to this invention, a monitor pattern can be provided with which variations in the dimensions of all of the element forming patterns in an actual semiconductor integrated circuit device can be monitored and in which the precise finish dimension of the semiconductor integrated circuit device can be strictly ensured.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A semiconductor device in which a first monitor pattern for monitoring a variation in the dimension of a pattern of a semiconductor integrated circuit device is formed on a semiconductor substrate, the first monitor pattern comprising:

a first source, drain and sate (SDG) region pattern formed on the semiconductor substrate;

a second SDG region pattern formed on the semiconductor substrate;

at least one first gate wiring pattern formed on each of said first and second SDG region patterns;

a third SDG region pattern having an area different from the area of said first SDG region pattern and formed on the semiconductor substrate;

a fourth SDG region pattern having an area different from the area of said first SDG region pattern and formed on the semiconductor substrate; and at least one second gate wiring pattern formed on each of said third and fourth SDG region patterns.

2. A semiconductor device according to claim 1, wherein the areas of said first and second SDG region patterns are each set equal to a first area corresponding to a minimum permissible area according to a design rule of the semiconductor integrated circuit device, a gate dimension of said first gate wiring pattern is equal to the gate dimension of a minimum permissible width according to the design rule of the semiconductor integrated circuit device, the areas of said third and fourth SDG region patterns are each set to an area larger than the first area, and the gate dimension of said second gate wiring pattern is equal to the gate dimension of the minimum permissible width in the semiconductor integrated circuit device.

3. A semiconductor device according to claim 1, wherein the areas of said first and second SDG region patterns are each set equal to a minimum permissible area according to a design rule of the semiconductor integrated circuit device, a gate dimension of said first gate wiring pattern is equal to the gate dimension of a minimum permissible width according to the design rule of the semiconductor integrated circuit device, the areas of said third and fourth SDG region patterns are each set equal to an area of the SDG region pattern which is included in the semiconductor integrated circuit device more than any other SDG region pattern, and the gate dimension of said second gate wiring pattern is equal to the gate dimension of the minimum permissible width according to the design rule of the semiconductor integrated circuit device.

4. A semiconductor device according to claim 1, wherein the areas of the first and second SDG region patterns are each set to an area larger than a minimum permissible area according to a design rule of the semiconductor integrated circuit device, a gate dimension of said first gate wiring pattern is equal to the gate dimension of a minimum permissible width according to the design rule of the semiconductor integrated circuit device, the areas of said third and fourth SDG region patterns are each set equal to an area of the SDG region pattern which is included in the semiconductor integrated circuit device more than any other SDG region pattern, and the gate dimension of said second gate wiring pattern is equal to the gate dimension of a minimum permissible width according to the design rule of the semiconductor integrated circuit device.

5. A semiconductor device in which a first monitor pattern for monitoring a variation in the dimension of a pattern of a semiconductor integrated circuit device is formed on a semiconductor substrate, the first monitor pattern comprising:

a first source, drain and gate (SDG) region pattern formed on the semiconductor substrate;

a second SDG region pattern formed on the semiconductor substrate;

at least one first gate wiring pattern formed on each of said first and second SDG region patterns;

a third SDG region pattern having an area larger than the area of said first and second SDG region patterns and formed on the semiconductor substrate; and at least one second gate wiring pattern formed on said third SDG region pattern.

6. A semiconductor device according to claim 5, wherein the areas of said first and second SDG region patterns are each set equal to a minimum permissible area according to a design rule of the semiconductor integrated circuit device, a gate dimension of said first gate wiring pattern is equal to the gate dimension of minimum permissible width according to a design rule of the semiconductor integrated circuit device, the area of said third SDG region pattern is set to an area larger than an area of the SDG region pattern which is included in the semiconductor integrated circuit device more than any other SDG region pattern, and the gate dimension of said second gate wiring pattern is equal to the gate dimension of a minimum permissible width according to the design rule of the semiconductor integrated circuit device.

7. A semiconductor device according to claim 5, wherein the areas of said first and second SDG region patterns are each set equal to a minimum permissible area according to a design rule of the semiconductor integrated circuit device, a gate dimension of said first gate wiring pattern is equal to the gate dimension of a minimum permissible width according to a design rule of the semiconductor integrated circuit device, the area of said third SDG region pattern is set to an area in which the film thickness of a resist film is stable in the semiconductor integrated circuit device, and the gate dimension of said second gate wiring pattern is equal to the gate dimension of a minimum permissible width according to the design rule of the semiconductor integrated circuit device.

8. A semiconductor device according to claim 5, wherein the areas of said first and second SDG region patterns are each set to an area larger than a minimum permissible area according to a design rule of the semiconductor integrated circuit device, a gate dimension of said first gate wiring pattern is equal to the gate dimension of a minimum permissible width according to a design rule of the semiconductor integrated circuit device, the area of said third SDG region pattern is set to an area larger than an area of the SDG region pattern which is included in the semiconductor integrated circuit device more than any other SDG region pattern, and the gate dimension of said second gate wiring pattern is equal to the gate dimension of a minimum permissible width according to the design rule of the semiconductor integrated circuit device.

9. A semiconductor device according to claim 5, wherein the areas of said first and second SDG region patterns are each set to an area larger than a minimum permissible area according to a design rule of the semiconductor integrated circuit device, a gate dimension of said first gate wiring pattern is equal to the gate dimension of minimum permissible width according to the design rule in the semiconductor integrated circuit device, the area of said third SDG region pattern is set to an area in which the film thickness of a resist film is stable in the semiconductor integrated circuit device, and the gate dimension of said second gate wiring pattern is equal to the gate dimension of a minimum permissible width according to the design rule of the semiconductor integrated circuit device.

10. A semiconductor device according to claim 5, wherein the areas of said first and second SDG region patterns are each set equal to an area of the SDG region pattern which is included in the semiconductor integrated circuit device more than any other SDG region pattern, a gate dimension of said first gate wiring pattern is equal to the gate dimension of a minimum permissible width according to a design rule of the semiconductor integrated circuit device, the area of said third SDG region pattern is set to an area larger than an area of the SDG region pattern which is included in the semiconductor integrated circuit device more than any other SDG region pattern, and the gate dimension of said second gate wiring pattern is equal to the gate dimension of minimum permissible width according to the design rule in the semiconductor integrated circuit device.

11. A semiconductor device according to claim 5, wherein the areas of said first and second SDG region patterns are each set equal to an area of the SDG region pattern which is included in the semiconductor integrated circuit device more than any other SDG region pattern, a gate dimension of said first gate wiring pattern is equal to the gate dimension of minimum permissible width according to a design rule of the semiconductor integrated circuit device, the area of said third SDG region pattern is set to an area in which the film thickness of a resist film is stable in the semiconductor integrated circuit device, and the gate dimension of said second gate wiring pattern is equal to the gate dimension of a minimum permissible width according to the design rule of the semiconductor integrated circuit device.

12. A semiconductor device in which a first monitor pattern for monitoring a variation in the dimension of a pattern of a semiconductor integrated circuit device is formed on a semiconductor substrate, the first monitor pattern comprising:

a first source, drain and gate (SDG) region pattern formed on the semiconductor substrate;

a second SDG region pattern formed on the semiconductor substrate;

at least one first gate wiring pattern formed on each of said first and second SDG region patterns;

a third SDG region pattern formed on the semiconductor substrate;

a fourth SDG region pattern formed on the semiconductor substrate; and second gate wiring patterns formed on each of said third and fourth SDG region patterns, the number of said second gate wiring patterns being larger than said first gate wiring pattern.

13. A semiconductor device according to claim 12, wherein the areas of said first to fourth SDG region patterns are each set equal an area of the SDG region pattern which is included in the semiconductor integrated circuit device more than any other SDG region pattern, a gate dimension of each of said first and second gate wiring patterns is equal to the gate dimension of a minimum permissible width according to a design rule of the semiconductor integrated circuit device, and said second gate wiring patterns are formed at minimum permissible intervals according to a design rule of the semiconductor integrated circuit device.

14. A semiconductor device in which a first monitor pattern for monitoring a variation in the dimension of a pattern of a semiconductor integrated circuit device is formed on a semiconductor substrate, the first monitor pattern comprising:

a first source, drain and gate (SDG) region pattern formed on the semiconductor substrate;

a second SDG region pattern formed on the semiconductor substrate;

at least one first gate wiring pattern formed on each of said first and second SDG region patterns;

a third SDG region pattern formed in a first region on the semiconductor substrate in which a number of SDG regions are formed, the number of SDG regions formed in the first region being less than the number of SDG regions formed in a second region in which said first and second SDG regions are formed;

a fourth SDG region pattern formed in a third region on the semiconductor substrate in which a number of SDG regions are formed, the number of SDG regions formed in the third region being less than the number of SDG regions formed in the second region in which said first and second SDG regions are formed; and at least one second gate wiring pattern formed on each of said third and fourth SDG region patterns.

15. A semiconductor device according to claim 14, wherein the areas of said first and second SDG region patterns are each set equal to an area of the SDG region pattern which is included in the semiconductor integrated circuit device more than any other SDG region pattern, a gate dimension of said first gate wiring pattern is equal to the gate dimension of a minimum permissible width according to a design rule of the semiconductor integrated circuit device, the areas of said third and fourth SDG region patterns are each set equal to the area of the SDG region pattern which is included in the semiconductor integrated circuit device more than any other SDG region pattern, and the gate dimension of said second gate wiring pattern is equal to the gate dimension of a minimum permissible width according to the design rule of the semiconductor integrated circuit device.

16. A semiconductor device according to claim 14, wherein the areas of said first and second SDG region patterns are each set to a minimum permissible area according to a design rule in the semiconductor integrated circuit device, a gate dimension of said first gate wiring pattern is equal to the gate dimension of a minimum permissible width according to the design rule of the semiconductor integrated circuit device, the areas of said third and fourth SDG region patterns are each set to the minimum permissible area according to the design rule of the semiconductor integrated circuit device, and the gate dimension of said second gate wiring pattern is equal to the gate dimension of a minimum permissible width according to the design rule of the semiconductor integrated circuit device.

17. A semiconductor device according to claim 1, wherein said first monitor pattern is formed on a scribe line adjacent to the semiconductor integrated circuit device.

18. A semiconductor device according to claim 5, wherein said first monitor pattern is formed on a scribe line adjacent to the semiconductor integrated circuit device.

19. A semiconductor device according to claim 12, wherein said first monitor pattern is formed on a scribe line adjacent to the semiconductor integrated circuit device.

20. A semiconductor device according to claim 14, wherein said first monitor pattern is formed on a scribe line adjacent to the semiconductor integrated circuit device.

21. A semiconductor device according to claim 1, wherein said first monitor pattern is formed in a space area of the semiconductor integrated circuit device.

22. A semiconductor device according to claim 5, wherein said first monitor pattern is formed in a space area of the semiconductor integrated circuit device.

23. A semiconductor device according to claim 12, wherein said first monitor pattern is formed in a space area of the semiconductor integrated circuit device.

24. A semiconductor device according to claim 14, wherein said first monitor pattern is formed in a space area of the semiconductor integrated circuit device.

25. A semiconductor device according to claim 1, further comprising a second monitor pattern formed on the semiconductor substrate and obtained by rotating said first monitor pattern by 90°.

26. A semiconductor device according to claim 5, further comprising a second monitor pattern formed on the semiconductor substrate and obtained by rotating said first monitor pattern by 90°.

27. A semiconductor device according to claim 12, further comprising a second monitor pattern formed on the semiconductor substrate and obtained by rotating said first monitor pattern by 90°.

28. A semiconductor device according to claim 14, further comprising a second monitor pattern formed on the semiconductor substrate and obtained by rotating said first monitor pattern by 90°.

* * * * *